(12) United States Patent
Notoya et al.

(10) Patent No.: US 11,437,804 B2
(45) Date of Patent: Sep. 6, 2022

(54) SEMICONDUCTOR CIRCUIT AND SEMICONDUCTOR SYSTEM

(71) Applicants: Kabushiki Kaisha Toshiba, Tokyo (JP); Toshiba Electronic Devices & Storage Corporation, Tokyo (JP)

(72) Inventors: Koichi Notoya, Yokohama Kanagawa (JP); Hitoshi Imai, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 82 days.

(21) Appl. No.: 17/016,547

(22) Filed: Sep. 10, 2020

(65) Prior Publication Data

US 2021/0083467 A1 Mar. 18, 2021

(30) Foreign Application Priority Data

Sep. 12, 2019 (JP) .............................. JP2019-166273

(51) Int. Cl.
*H02H 1/00* (2006.01)
*H02H 9/04* (2006.01)
*G01R 19/165* (2006.01)

(52) U.S. Cl.
CPC ..... *H02H 1/0007* (2013.01); *G01R 19/16523* (2013.01); *H02H 9/04* (2013.01)

(58) Field of Classification Search
CPC .......... H02H 1/0007; H02H 9/04; H02H 3/04; G01R 19/16523; G01R 19/165; G01R 19/16571; H03M 13/1108; H03M 13/1111; H03M 13/1148
USPC ........................................................ 361/93.1
See application file for complete search history.

(56) References Cited

U.S. PATENT DOCUMENTS

| | | | | |
|---|---|---|---|---|
| 5,235,505 | A | * | 8/1993 | Hiruma ............ G01R 19/16571 363/56.03 |
| 7,369,067 | B2 | | 5/2008 | Kishi et al. |
| 8,447,185 | B2 | | 5/2013 | Uo |
| 8,761,599 | B2 | | 6/2014 | Uo |
| 2014/0022683 | A1 | * | 1/2014 | Brasola ................ H02H 1/0007 361/91.2 |
| 2017/0373603 | A1 | * | 12/2017 | Basso ...................... H02H 7/10 |
| 2020/0366079 | A1 | * | 11/2020 | Telefus ................. H01H 9/563 |

FOREIGN PATENT DOCUMENTS

| | | |
|---|---|---|
| JP | 2006-303663 A | 11/2006 |
| JP | 2007-274747 A | 10/2007 |
| JP | 2011-160096 A | 8/2011 |

(Continued)

*Primary Examiner* — Dharti H Patel
(74) *Attorney, Agent, or Firm* — Allen & Overy LLP

(57) ABSTRACT

A semiconductor circuit has a primary circuit that causes the light emitting element to emit light in accordance with a current flowing through a control target, and that causes the light emitting element to emit light brighter when an overcurrent flows through the control target; and a secondary circuit that is electrically insulated from the primary circuit, outputs a voltage according to a light emission amount of the light emitting element, and outputs an overcurrent detection signal indicating the brighter light emission in the light emitting element.

18 Claims, 4 Drawing Sheets

(56) References Cited

FOREIGN PATENT DOCUMENTS

| JP | 1876674 B2 | 2/2012 |
|----|------------|--------|
| JP | 2013-42280 A | 2/2013 |
| JP | 5611906 B2 | 10/2014 |

* cited by examiner

SEMICONDUCTOR CIRCUIT AND SEMICONDUCTOR SYSTEM

CROSS REFERENCE TO RELATED APPLICATIONS

This application is based upon and claims the benefit of priority from the prior Japanese Patent Application No. 2019-166273, filed on Sep. 12, 2019, the entire contents of which are incorporated herein by reference.

FIELD

Embodiments described herein relate generally to a semiconductor circuit and a semiconductor system.

BACKGROUND

A current detection circuit that detects a current flowing through a control target such as a motor uses an isolation amplifier. The isolation amplifier is characterized by having a capability of detecting and transmitting the current flowing through a control target while maintaining electrical insulation.

The isolation amplifier includes a signal processing circuit such as a ΔΣ ADC and a decoder. Since this signal processing circuit takes time for processing, the response time of current detection requires approximately several tens of μs. Because of this, there is a problem in that it is impossible to rapidly detect an overcurrent when the overcurrent flows through the control target.

DETAILED DESCRIPTION

According to one aspect of a semiconductor circuit has a primary circuit that causes the light emitting element to emit light in accordance with a current flowing through a control target, and that causes the light emitting element to emit light brighter when an overcurrent flows through the control target; and a secondary circuit that is electrically insulated from the primary circuit, outputs a voltage according to a light emission amount of the light emitting element, and outputs an overcurrent detection signal indicating the brighter light emission in the light emitting element.

Figure 1:
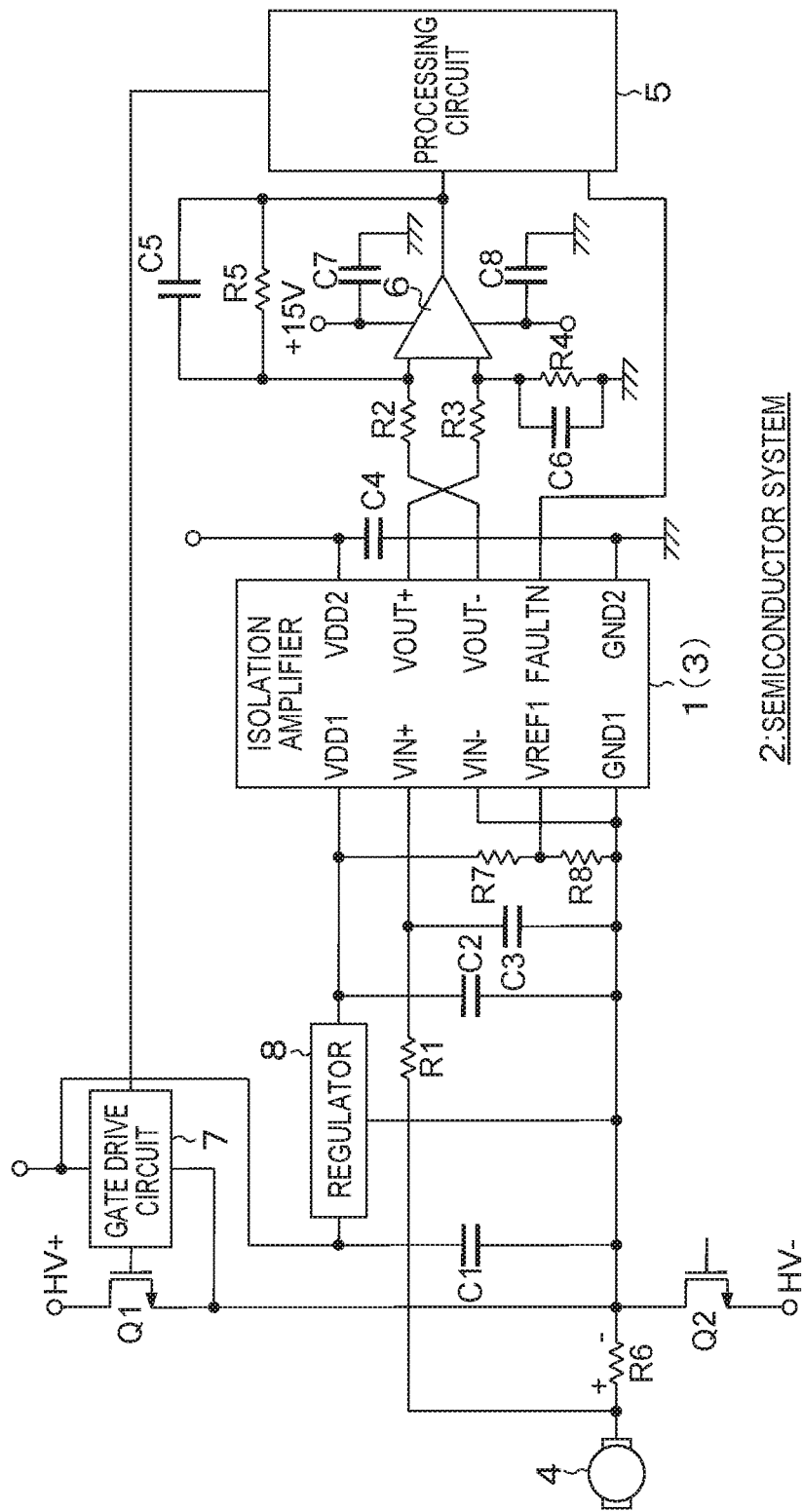
FIG. 1 is a block diagram illustrating a schematic configuration of a semiconductor system including a semiconductor circuit according to an embodiment.

FIG. 1 is a block diagram illustrating a schematic configuration of a semiconductor system 2 including a semiconductor circuit 1 according to an embodiment. The semiconductor circuit 1 in FIG. 1 includes an isolation amplifier 3. The isolation amplifier 3 detects a current flowing through the control target in an electrically insulated state, converts the current into a voltage, and outputs the voltage. This description is an example in which the control target is a motor 4. However, the control target is not necessarily limited to the motor 4 as long as the control target includes a circuit through which a current flows.

The semiconductor system 2 in FIG. 1 includes a processing circuit 5 that controls the motor 4. The processing circuit 5 performs feedback control of a control signal that controls the motor 4 based on the current flowing through the motor 4. The current flowing through the motor 4 is controlled by this control signal. The processing circuit 5 can be formed with an MPU, ASIC, DSP, or the like. In addition, the semiconductor system 2 in FIG. 1 includes the isolation amplifier 3, an amplifier 6 that amplifies the output signal of the isolation amplifier 3, a high-side transistor Q1 and a low-side transistor Q2 that drive the motor 4, a gate drive circuit 7 that controls a gate voltage of the high-side transistor Q1, a regulator 8 that generates a power supply voltage VDD1 of the isolation amplifier 3, resistors R1 to R6, and capacitors C1 to C8.

The control signal output from the processing circuit 5 is input to the gate drive circuit 7. The gate drive circuit 7 drives the gate of the high-side transistor Q1 based on the control signal. Although illustrated is omitted in FIG. 1, a gate drive circuit 7 (not illustrated) that drives the gate of the low-side transistor Q2 is also controlled by a control signal from the processing circuit 5.

The control signal from the processing circuit 5 turns on/off the high-side transistor Q1 and the low-side transistor Q2, thereby controlling the current supplied to the motor 4 and the direction of the current.

There is a shunt resistor R6 connected between one end of the motor 4 and the ground node GND1, and a current flowing through the motor 4 flows through the shunt resistor R6. Therefore, the voltage across the shunt resistor R6 is a voltage corresponding to the current flowing through the motor 4. This voltage is input to a VIN+ terminal of the isolation amplifier 3 via the resistor R1. The VIN− terminal of the isolation amplifier 3 is connected to the ground node GND1.

The voltage adjusted by the regulator 8 is input to the isolation amplifier 3 as the power supply voltage VDD1. The isolation amplifier 3 detects the voltage input to VIN+ in an electrically insulated state, and outputs as a differential voltage corresponding to the current flowing through the motor 4 from VOUT+ and VOUT−. These differential output voltages are input to the amplifier 6 via the resistors R2 and R3. The amplifier 6 amplifies the differential output voltage output from the isolation amplifier 3 and inputs the amplified voltage to the processing circuit 5.

Figure 2:
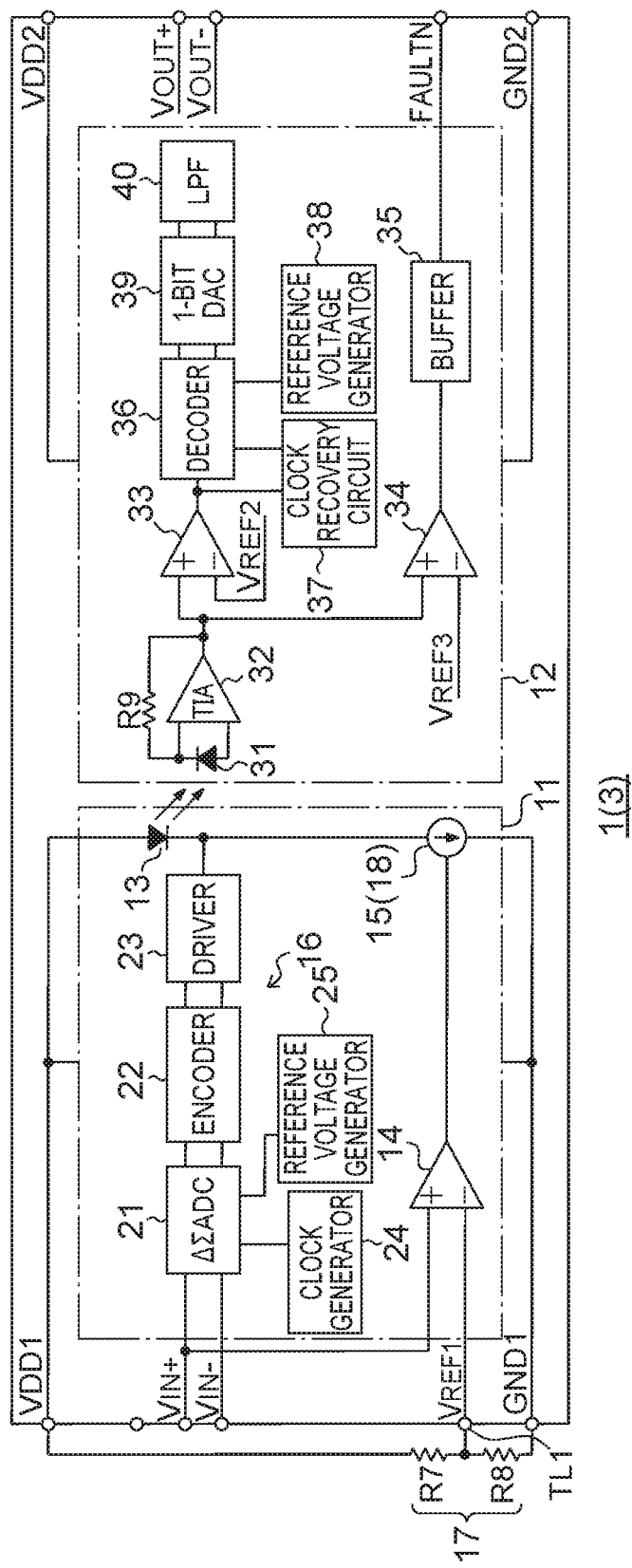
FIG. 2 is a block diagram illustrating an example of an internal configuration of the isolation amplifier of FIG. 1.

FIG. 2 is a block diagram illustrating an example of an internal configuration of the isolation amplifier 3 of FIG. 1. The isolation amplifier 3 in FIG. 2 includes a primary circuit 11 and a secondary circuit 12. The primary circuit 11 causes a light emitting element 13 to emit light in accordance with the current flowing through the motor 4. The secondary circuit 12 is electrically insulated from the primary circuit 11 and outputs a voltage corresponding to the light emission amount of the light emitting element 13.

The primary circuit 11 includes a first comparator 14, a first voltage controller 15, and a second voltage controller 16. The first comparator 14 determines whether the voltage corresponding to the current flowing through the motor 4 exceeds a first reference voltage VREF1. The first reference voltage VREF1 is generated by a resistance voltage divider circuit 17 using external resistors R7 and R8, for example. With the external resistors R7 and R8 attached to the semiconductor circuit 1 of FIG. 1, the user can set the voltage level of the first reference voltage VREF1 to a desired level. The semiconductor circuit 1 of FIG. 1 includes an external connection terminal TL1 so that the resistors R7 and R8 can be externally attached.

In a case where the first reference voltage VREF1 is to be a fixed voltage, a reference voltage generation circuit for generating the first reference voltage VREF1 may be provided in the semiconductor circuit 1 of FIG. 1.

The first reference voltage VREF1 is set to a voltage level for detecting an overcurrent that has flowed through the motor 4. The more the current flowing through the motor 4, the higher the voltage across the shunt resistor R6 and the higher the voltage at the VIN+ terminal of the primary circuit 11. When the voltage at the VIN+ terminal exceeds the first reference voltage VREF1, the first comparator 14 detects an overcurrent and sets the output level to a high voltage, for example.

The first voltage controller 15 controls the one end side voltage (cathode voltage) of the light emitting element 13 so that it emits light having a larger light emission amount when the first comparator 14 determines that the first reference voltage VREF1 is exceeded, than when the first comparator 14 determines that the first reference voltage VREF1 is not exceeded. The first voltage controller 15 includes a constant current circuit (current switching circuit) 18 with an on/off function, for example. The constant current circuit 18 is connected on one end to the cathode of the light emitting element 13, and connected on the other end to the ground node GND1. When the first comparator 14 determines that the first reference voltage VREF1 is exceeded, the constant current circuit 18 causes a constant current to flow from the cathode of the light emitting element 13 to the ground node GND1. This allows the cathode current to flow more than usual, leading to brighter light emission in the light emitting element 13. In contrast, when the first comparator 14 determines that the first reference voltage VREF1 has not been exceeded, the constant current circuit 18 stops output of the constant current. This causes the current from the cathode of the light emitting element 13 to flow only to the second voltage controller 16 described below, leading to darker light emission in the light emitting element 13 than when the constant current circuit 18 passes a constant current.

The second voltage controller 16 includes a $\Delta\Sigma$ ADC 21, an encoder 22, a driver 23, a clock generator 24, and a reference voltage generator 25, for example. The $\Delta\Sigma$ ADC 21 converts a voltage corresponding to the current flowing through the motor 4 into a digital signal in synchronization with a clock signal generated by the clock generator 24. The encoder 22 encodes the digital signal converted by the $\Delta\Sigma$ ADC 21. The driver 23 generates the cathode voltage of the light emitting element 13 based on the output signal of the encoder 22. The voltage corresponding to the current flowing through the motor 4 is converted into a digital signal by the $\Delta\Sigma$ ADC 21 and encoded by the encoder 22. The driver 23 controls the cathode voltage of the light emitting element 13 based on the output signal of the encoder 22. The light emitting element 13 emits light with a light emission amount according to the cathode voltage, that is, a light emission amount according to the current flowing through the motor 4. At this time, as described above, when the constant current circuit 18 in the first voltage controller 15 causes a constant current to flow, the cathode current of the light emitting element 13 increases, allowing brighter light emission in the light emitting element 13.

In this manner, the light emission intensity of the light emitting element 13 varies depending on whether the constant current circuit 18 in the first voltage controller 15 passes a constant current.

The secondary circuit 12 in the isolation amplifier 3 of FIG. 2 includes a photodetector 31, a transimpedance amplifier (TIA) 32, a second comparator 33, a third comparator 34, a buffer 35, and a decoder 36, a clock recovery circuit 37, a reference voltage generator 38, a 1-bit DAC 39, and a low-pass filter (LPF) 40. The second comparator 33, the decoder 36, the clock recovery circuit 37, the reference voltage generator 38, the 1-bit DAC 39, and the low-pass filter 40 constitute a third voltage controller. There is a capacitor C4 connected between a power supply voltage VDD2 input to the secondary circuit 12 and a ground node GND2.

The photodetector 31 outputs a current corresponding to the light emission amount of the light emitting element 13. The photodetector 31 is electrically insulated from the light emitting element 13, receives light emitted from the light emitting element 13, performs photoelectric conversion, and outputs a photoelectrically converted current.

The transimpedance amplifier 32 converts the current output from the photodetector 31 into a voltage. The voltage output from the transimpedance amplifier 32 is input to the second comparator 33 and the third comparator 34. The second comparator 33 determines whether the voltage output from the transimpedance amplifier 32 exceeds a second reference voltage. The third comparator 34 determines whether the voltage output from the transimpedance amplifier 32 exceeds a third reference voltage that is higher than the second reference voltage. When it is determined that the voltage exceeds the third reference voltage, the third comparator 34 outputs an overcurrent detection signal. The second reference voltage and the third reference voltage may be generated in the semiconductor circuit 1 of FIG. 1, or may be generated by an external resistance voltage divider circuit.

The output signal of the second comparator 33 is input to the decoder 36. The decoder 36 performs a decoding process based on the output signal of the second comparator 33. This decoding process is a process for returning the signal encoded by the encoder 22 in the second voltage controller 16 to the signal before encoding.

The 1-bit DAC 39 converts the signal decoded by the decoder 36 into an analog signal. The low-pass filter 40 removes unnecessary frequency components included in the analog signal output from the 1-bit DAC 39 and outputs differential voltages VOUT+ and VOUT− from the output terminals. This differential voltage is input to the amplifier 6 in FIG. 1.

The third comparator 34 is provided to detect an overcurrent that has flowed through the motor 4. When an overcurrent flows through the motor 4, the light emitting element 13 performs brighter light emission as described above. This increases the current flowing through the photodetector 31 in the secondary circuit 12, leading to an increase in the output voltage of the transimpedance amplifier 32. Therefore, the output voltage of the transimpedance amplifier 32 input to the third comparator 34 exceeds the third reference voltage, and the output signal of the third comparator 34 indicates a high voltage. The output signal of the third comparator 34 is output from a FAULTN terminal of the semiconductor circuit 1 of FIG. 1 via the buffer 35. The FAULTN terminal is a terminal for notifying overcurrent detection, and indicates a high voltage when an overcurrent flows through the motor 4, for example. Therefore, monitoring the voltage at the FAULTN terminal of the semiconductor circuit 1 of FIG. 1 makes it possible to rapidly grasp that an overcurrent has flowed through the motor 4.

Figure 3:
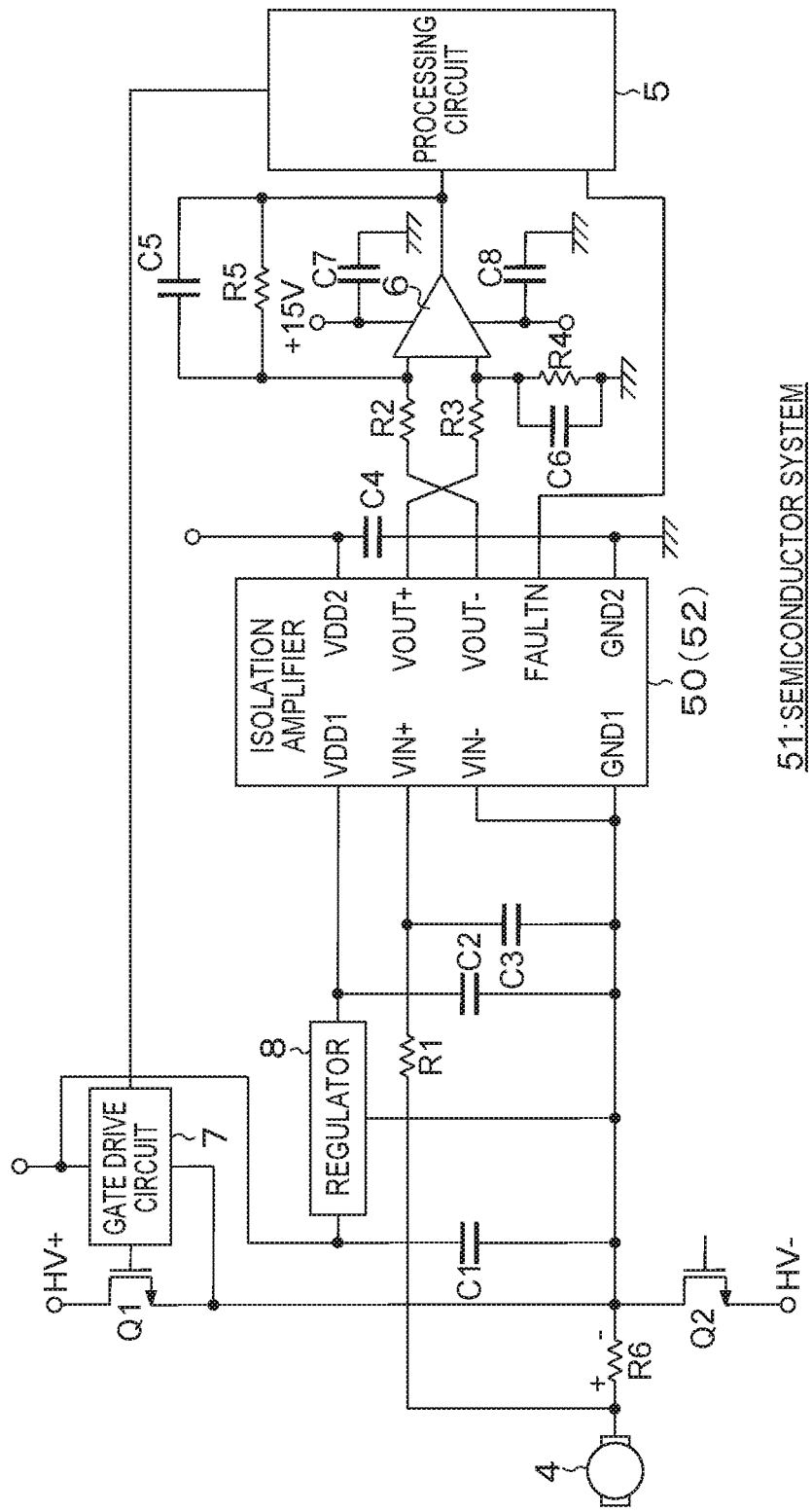
FIG. 3 is a block diagram illustrating a schematic configuration of a semiconductor system including a semiconductor circuit of a comparative example.

FIG. 3 is a block diagram illustrating a schematic configuration of a semiconductor system 51 including a semiconductor circuit 50 according to a comparative example. Comparing FIG. 3 with FIG. 1, an isolation amplifier 52 in the semiconductor circuit 50 of FIG. 3 includes neither the VREF1 terminal nor the resistance voltage divider circuit 17 using a resistor connected to the VREF1 terminal. In other portions, the semiconductor circuits 1 of FIGS. 1 and 3 have a similar configuration.

Figure 4:
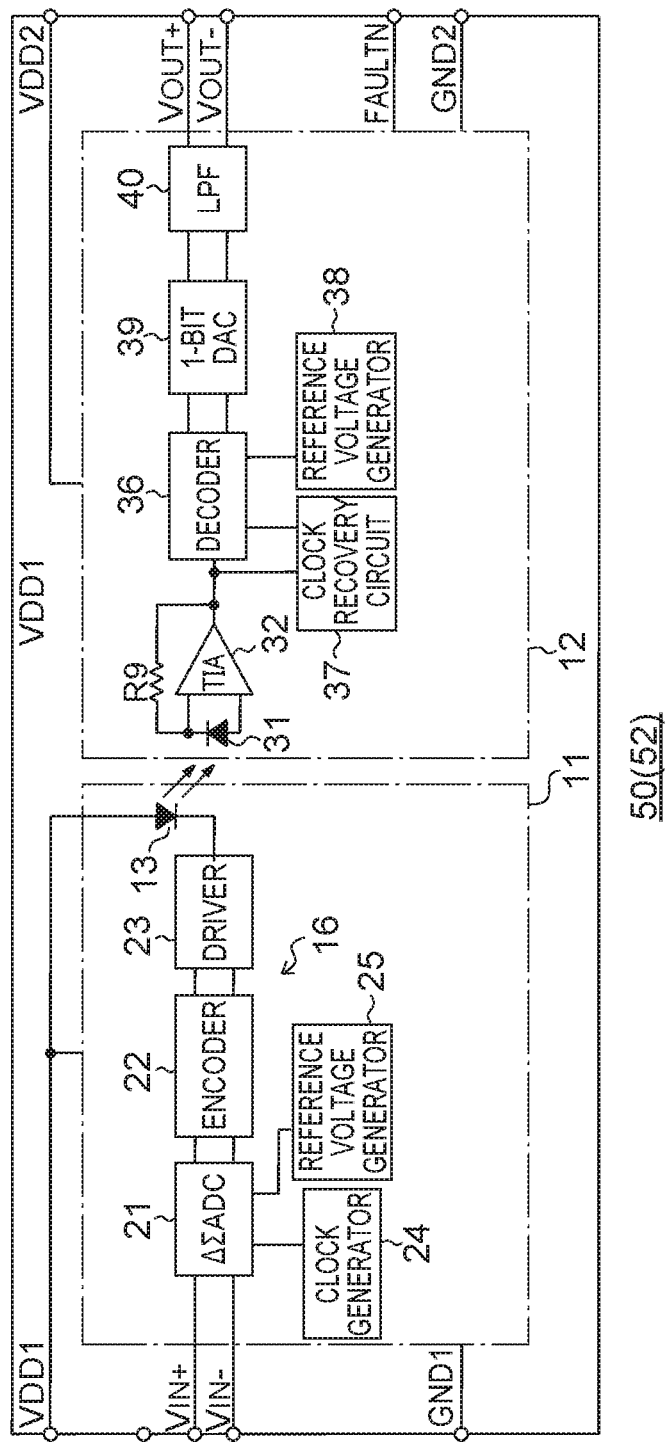
FIG. 4 is a block diagram illustrating an internal configuration of an isolation amplifier of a comparative example.

FIG. 4 is a block diagram illustrating an internal configuration of an isolation amplifier 52 according to a comparative example. Comparing FIG. 4 with FIG. 2, the primary circuit 11 in the isolation amplifier 52 of FIG. 4 does not include the first comparator 14. Furthermore, the secondary circuit 12 in the isolation amplifier 52 of FIG. 4 includes neither the third comparator 34 nor the buffer 35, while other configurations are similar to FIG. 2.

The isolation amplifier 52 in FIG. 4 detects the voltage corresponding to the current flowing through the motor 4 with the decoder 36 and the 1-bit DAC 39, and it is possible to detect the overcurrent that flowed through the motor 4 with the decoder 36 and the 1-bit DAC 39. However, since processing on the decoder 36 and the 1-bit DAC 39 takes time, it takes time to determine whether there is an overcurrent.

In contrast, in the isolation amplifier 3 of FIG. 2, an overcurrent flowing through the motor 4 leads to brighter light emission in the light emitting element 13. When the brighter light emission of the light emitting element 13 is detected at the third comparator 34, the FAULTN terminal transitions to a high voltage, for example. With this configuration, it is possible to achieve prompt transition of the voltage level of the FULTN terminal without performing the decoding process and the D/A conversion process as illustrated in FIG. 2, making it possible to rapidly perform overcurrent detection.

Although FIG. 4 has no illustration of what corresponds to the second comparator 33 of FIG. 2, FIG. 4 also includes what corresponds to the second comparator 33 in practice, which being simply omitted in FIG. 4. Therefore, the difference in the configuration of the secondary circuit 12 of FIGS. 2 and 4 is absence of the third comparator 34 and the buffer 35 in FIG. 4.

In this manner, in the present embodiment, the first comparator 14 is provided in the primary circuit 11, and the third comparator 34 and the buffer 35 are provided in the secondary circuit 12. With this configuration, an overcurrent flowing through the motor 4 leads to brighter light emission in the light emitting element 13, and then, it is possible to detect the brighter light emission of the light emitting element 13 at the third comparator 34, so as to output an overcurrent detection signal from the FAULTN terminal. This makes it possible to rapidly detect that an overcurrent that has flowed through the motor 4.

Moreover, the present embodiment is implementable with a simple circuit change, as compared with the comparative example, specifically, simply adding the first comparator 14 into the primary circuit 11 and adding the third comparator 34 into the secondary circuit 12, leading to facilitation in design change. Furthermore, the use of an external resistor enables the user to set the current level of the overcurrent to a desired level in the present embodiment, making it possible to be applied to various applications with high versatility.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor circuit comprising:
   a primary circuit that causes the light emitting element to emit light in accordance with a current flowing through a control target, and that causes the light emitting element to emit light brighter when an overcurrent flows through the control target; and
   a secondary circuit that is electrically insulated from the primary circuit, outputs a voltage according to a light emission amount of the light emitting element, and outputs an overcurrent detection signal indicating the brighter light emission in the light emitting element,
   wherein the primary circuit comprises:
   a first comparator that determines whether a voltage corresponding to the current flowing through the control target exceeds a first reference voltage; and
   a first voltage controller that controls one end side voltage of the light emitting element so that the element emits light having a larger light emission amount when the first comparator determines that the first reference voltage is exceeded, than when the first comparator determines that the first reference voltage is not exceeded.

2. The semiconductor circuit according to claim 1,
   wherein the secondary circuit comprises:
   a photodetector that outputs a current corresponding to the light emission amount of the light emitting element;
   a transimpedance amplifier that converts the current output from the photodetector into a voltage;
   a second comparator that determines whether the voltage output from the transimpedance amplifier exceeds a second reference voltage; and
   a third comparator that determines whether the voltage output from the transimpedance amplifier exceeds a third reference voltage higher than the second reference voltage, and that outputs the overcurrent detection signal when it is determined that the voltage exceeds the third reference voltage.

3. The semiconductor circuit according to claim 2, further comprising a third voltage controller that decodes an output signal of the second comparator and converts the signal into an analog signal when the second comparator determines that the second reference voltage is exceeded.

4. The semiconductor circuit according to claim 1,
   wherein the first voltage controller comprises a current switching circuit that is connected to one end of the light emitting element, and that switches whether to pass a predetermined current based on determination of the first comparator regarding whether the first reference voltage is exceeded.

5. The semiconductor circuit according to claim 4,
   wherein when the current switching circuit passes the predetermined current, the voltage at one end of the light emitting element decreases to a predetermined reference voltage, thereby causing the light emitting element to emit light brighter.

6. The semiconductor circuit according to claim 1, further comprising a setting terminal that sets a voltage level of the first reference voltage.

7. The semiconductor circuit according to claim 1,
wherein the primary circuit comprises:
a second voltage controller that controls one end side voltage of the light emitting element so that the element emits light having a smaller light emission amount when the first comparator determines that the first reference voltage is not exceeded, than when the first comparator determines that the first reference voltage is exceeded.

8. The semiconductor circuit according to claim 7,
wherein the second voltage controller converts a voltage corresponding to a current flowing through the control target into a digital signal and encodes the digital signal to generate one end side voltage of the light emitting element.

9. A semiconductor system comprising:
a processing circuit that performs feedback control of a control signal that controls the control target based on a current flowing through the control target; and
a semiconductor circuit that detects a current flowing through the control target,
wherein the semiconductor circuit comprises:
a primary circuit that causes the light emitting element to emit light in accordance with a current flowing through a control target, and that causes the light emitting element to emit light brighter when an overcurrent flows through the control target; and
a secondary circuit that is electrically insulated from the primary circuit, outputs a voltage according to a light emission amount of the light emitting element, and outputs an overcurrent detection signal indicating the brighter light emission in the light emitting element,
wherein the primary circuit comprises:
a first comparator that determines whether a voltage corresponding to a current flowing through the control target exceeds a first reference voltage; and
a first voltage controller that controls one end side voltage of the light emitting element so that the element emits light having a larger light emission amount when the first comparator determines that the first reference voltage is exceeded, than when the first comparator determines that the first reference voltage is not exceeded.

10. The semiconductor system according to claim 9,
wherein the secondary circuit comprises:
a photodetector that outputs a current corresponding to the light emission amount of the light emitting element;
a transimpedance amplifier that converts the current output from the photodetector into a voltage;
a second comparator that determines whether the voltage output from the transimpedance amplifier exceeds a second reference voltage; and
a third comparator that determines whether the voltage output from the transimpedance amplifier exceeds a third reference voltage higher than the second reference voltage, and that outputs the overcurrent detection signal when it is determined that the voltage exceeds the third reference voltage.

11. The semiconductor system according to claim 10,
further comprising a third voltage controller that decodes an output signal of the second comparator and converts the signal into an analog signal when the second comparator determines that the second reference voltage is exceeded.

12. The semiconductor system according to claim 9,
wherein the first voltage controller comprises a current switching circuit that is connected to one end of the light emitting element, and that switches whether to pass a predetermined current based on determination of the first comparator regarding whether the first reference voltage is exceeded.

13. The semiconductor system according to claim 12,
wherein when the current switching circuit passes the predetermined current, the voltage at one end of the light emitting element decreases to a predetermined reference voltage, thereby causing the light emitting element to emit light brighter.

14. The semiconductor system according to claim 9,
further comprising a setting terminal that sets a voltage level of the first reference voltage.

15. The semiconductor system according to claim 9,
wherein the primary circuit comprises:
a second voltage controller that controls one end side voltage of the light emitting element so that the element emits light having a smaller light emission amount when the first comparator determines that the first reference voltage is not exceeded, than when the first comparator determines that the first reference voltage is exceeded.

16. The semiconductor system according to claim 15,
wherein the second voltage controller converts a voltage corresponding to a current flowing through the control target into a digital signal and encodes the digital signal to generate one end side voltage of the light emitting element.

17. A semiconductor circuit comprising:
a primary circuit that provide an transmitting signal with an amplitude in accordance with a current flowing through a control target, the amplitude being larger when an overcurrent flows through the control target; and
a secondary circuit that is electrically insulated from the primary circuit, outputs a voltage according to the amplitude of the transmitting signal, and outputs an overcurrent detection signal indicating that the overcurrent flows through the control target,
wherein the primary circuit comprises a first comparator that determines whether a voltage corresponding to the current flowing through the control target exceeds a first reference voltage, and causes the amplitude of the transmitting signal to be larger when the first comparator determines that the first reference voltage is exceeded, than when the first comparator determines that the first reference voltage is not exceeded.

18. A semiconductor system comprising:
a processing circuit that performs feedback control of a control signal that controls the control target based on a current flowing through the control target; and
the semiconductor circuit according to the claim 17.

* * * * *